US006813216B2

(12) United States Patent
Lee

(10) Patent No.: US 6,813,216 B2
(45) Date of Patent: Nov. 2, 2004

(54) METHOD FOR DISCHARGING WORD LINE AND SEMICONDUCTOR MEMORY DEVICE USING THE SAME

(75) Inventor: Jae-Goo Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 5 days.

(21) Appl. No.: 10/324,207

(22) Filed: Dec. 19, 2002

(65) Prior Publication Data

US 2003/0137889 A1 Jul. 24, 2003

(30) Foreign Application Priority Data

Jan. 24, 2002 (KR) .......................................... 2002-4150

(51) Int. Cl.[7] .............................................. G11C 7/00
(52) U.S. Cl. .......................... 365/230.06; 365/185.23; 365/189.09
(58) Field of Search ..................... 365/230.06, 189.09, 365/185.23

(56) References Cited

U.S. PATENT DOCUMENTS 5,650,976 A * 7/1997 McLaury ............... 365/230.06
5,926,433 A * 7/1999 McLaury ............... 365/230.06
6,111,809 A * 8/2000 Micheloni et al. ..... 365/230.06

* cited by examiner

Primary Examiner—Vu A. Le
(74) Attorney, Agent, or Firm—Marger Johnson & McCollom, P.C.

(57) ABSTRACT

A method for discharging a word line in a semiconductor memory device having a negative word line structure, and a word line discharge circuit for such a device, are described. The method includes the steps of discharging the word line to a first power supply through a first switch that is connected to the word line until the first switch reaches a threshold voltage, and simultaneously, discharging the word line to a second power supply through a second switch that is connected to the word line. The word line continues to discharge to the second power supply through the second switch after the first switch reaches the threshold voltage. When the first power supply is a ground reference and the second power supply is a negative voltage supply generated on the device, the level of the negative voltage can be stably maintained. Thus, the refresh characteristics of the semiconductor memory device are improved, and current consumption of the negative voltage generator can be reduced.

22 Claims, 4 Drawing Sheets

METHOD FOR DISCHARGING WORD LINE AND SEMICONDUCTOR MEMORY DEVICE USING THE SAME

This application claims priority from Korean Patent Application No. 2002-4150, filed on Jan. 24, 2002, the contents of which are incorporated herein by this reference in their entirety.

BACKGROUND OF THE INVENTION

1. Field of the Invention

The present invention relates to a method for discharging a word line, and more particularly, to a method for discharging a word line in which a negative voltage is stably maintained in a negative word line structure, and a semiconductor memory device using the same.

2. Description of the Related Art

A dynamic random access memory (DRAM) requires a refresh operation so as to maintain data (or charge) that is stored in a memory cell capacitor. A negative word line structure has been developed to improve the refresh characteristics of the DRAM.

In order to maintain word lines in a precharge or standby state at a predetermined negative voltage in the negative word line structure, a negative voltage generator is required. In a case where the negative voltage is unstable, the refresh characteristics deteriorate, and thus it is most important to stably maintain the negative voltage in the negative word line structure.

FIG. 1 is a block diagram of a conventional row address decoder. A main row decoder 20 activates a main word line select signal WEI1 or WEI2 in response to a second address ADDR 2~8, and a sub row decoder 10 activates a sub word line select signal PXID1, PXI2, PXI3, or PXI4 in response to a first address ADDR 0~1.

A PXID generator 31 outputs a delayed sub word line select signal PXID1 and an inverted sub word line select signal PXIB1 in response to the sub word line select signal PXI1 to sub word line drivers 33 and 35.

The sub word line driver SWD1 33 drives a word line WL1 in response to the main word line select signal WEI1 and the sub word line select signals PXID1 and PXIB1.

In addition, the sub word line driver SWD5 35 drives a word line WL5 in response to the main word line select signal WEI2 and the sub word line select signals PXID1 and PXIB1.

Thus, the PXID generator 31 and the sub word line driver 33 constitute a word line select circuit 30. The PXID generator 31 is positioned in a conjunction region, and the sub word line drivers 33 and 35 are positioned between memory array blocks.

Operation of the other PXID generators and sub word line drivers in FIG. 1 is similar to that of PXID generator 31 and sub word line driver 33, and thus a detailed description thereof is omitted.

FIG. 2 is a circuit diagram of the word line select circuit 30 of FIG. 1. FIG. 3 is a timing diagram for operation of circuit 30 shown in FIG. 2. Referring to FIGS. 1 through 3, PXID represents a signal by which the level of a word line WL is determined and a boosting voltage VPP is supplied to the word line WL, the PXID signal swings between the boosting voltage VPP and a negative voltage VNN.

The boosting voltage VPP is higher than a supply voltage VCCA that is supplied to a semiconductor memory device and is output from a boosting voltage generator (not shown) in the semiconductor memory device.

As shown in FIG. 3, the discharge level of control signals WEI, PXID, and PXIB for controlling the sub word line driver 33 is the negative voltage VNN. If the load on a PXID line is large, the semiconductor memory device requires a large-capacity negative voltage VNN generator (not shown) so as to smoothly discharge the control signal PXID.

When the level of the sub word line select signal PXI transitions from the boosting voltage VPP to the negative voltage VNN, most of the discharge current of the PXID, that is, the discharge current of the word line WL, is discharged to the negative voltage VNN through an inverter in the PXID generator 31.

A transistor 3 is turned on in response to the control signal PXIB, and the PXID, along with the word line WL, are discharged from the level of the boosting voltage VPP to the level of the negative voltage VNN through the transistor 3. Thus the discharge current of the PXID is rapidly flowed into the negative voltage VNN generator. Accordingly, the negative voltage VNN becomes unstable, and therefore the refresh characteristics deteriorate.

SUMMARY OF THE INVENTION

It is an object of the present invention to provide a method for discharging a word line in which a negative voltage is stably maintained using the voltage level of a PXID or word line WL, and a semiconductor memory device using the same.

According to one embodiment of the present invention, there is provided a method for discharging a word line, the method comprising discharging the word line to a first power supply through a first switch that is connected to the word line until the first switch reaches a threshold voltage, and simultaneously, discharging the word line to a second power supply through a second switch that is connected to the word line, and then discharging the word line to the second power supply through the second switch after the first switch reaches the threshold voltage.

According to another embodiment of the present invention, there is provided a method for discharging a word line, the method comprising discharging the word line to a first power supply through a first switch that is turned on in response to the voltage of the word line, and simultaneously, discharging the word line to a second power supply through a second switch that is connected to the word line, and then discharging the word line to the second power supply through the second switch after the first switch is turned off in response to a reduction in voltage on the word line.

According to another embodiment of the present invention, there is provided a method for discharging a word line, the method comprising discharging current from the word line to a first power supply through a first current path that is formed in response to a predetermined word line select signal and the voltage of the word line, and simultaneously, discharging current from the word line to a second power supply through a second current path that is formed in response to the word line select signal, and discharging current from the word line to the second power supply through the second current path when the first current path is blocked in response to a reduction in voltage on the word line.

According to another embodiment of the present invention, there is provided a semiconductor memory device. The semiconductor memory device includes a word line, a first switch that is connected between the word line and a first power supply and discharges current from the word line to the first power supply in response to a word line select signal and the voltage of the word line, and a second switch that is connected between the word line and a second power supply and discharges current from the word line to the second power supply in response to the word line select signal.

According to another embodiment of the present invention, there is provided a semiconductor memory device. The semiconductor memory device includes a word line, a transistor that is connected between the word line and a first power supply and discharges current from the word line to the first power supply in response to a word line select signal and the voltage of the word line, and a second switch that is connected between the word line and a second power supply and discharges current from the word line to the second power supply in response to the word line select signal.

According to another embodiment of the present invention, there is provided a semiconductor memory device. The semiconductor memory device includes a word line, a first pull-up circuit for pulling up the word line to the level of a boosting voltage in response to a word line select signal, a first node, a switch for connecting the first node to the word line in response to the word line select signal, a first pull-down circuit for pulling down the word line to the level of a ground voltage in response to the voltage at the first node, and a second pull-down circuit for pulling down the word line to the level of a negative voltage in response to the word line select signal. The first pull-down circuit is deactivated when the voltage at the first node becomes lower than a predetermined voltage.

In many of the above embodiments of the invention it is preferable that the first switch is a first transistor having a first threshold voltage, and the second switch is a second transistor having a second threshold voltage, and the second threshold voltage is higher than the first threshold voltage. It is also preferable that the word line includes a sub word line select signal line. The first power supply is preferably ground power supply, and the second power supply is preferably a negative power supply.

BRIEF DESCRIPTION OF THE DRAWINGS

The above object and advantages of the present invention will become more apparent by describing in detail preferred embodiments thereof with reference to the attached drawings, in which.

DETAILED DESCRIPTION OF THE EMBODIMENTS

Figure 1:
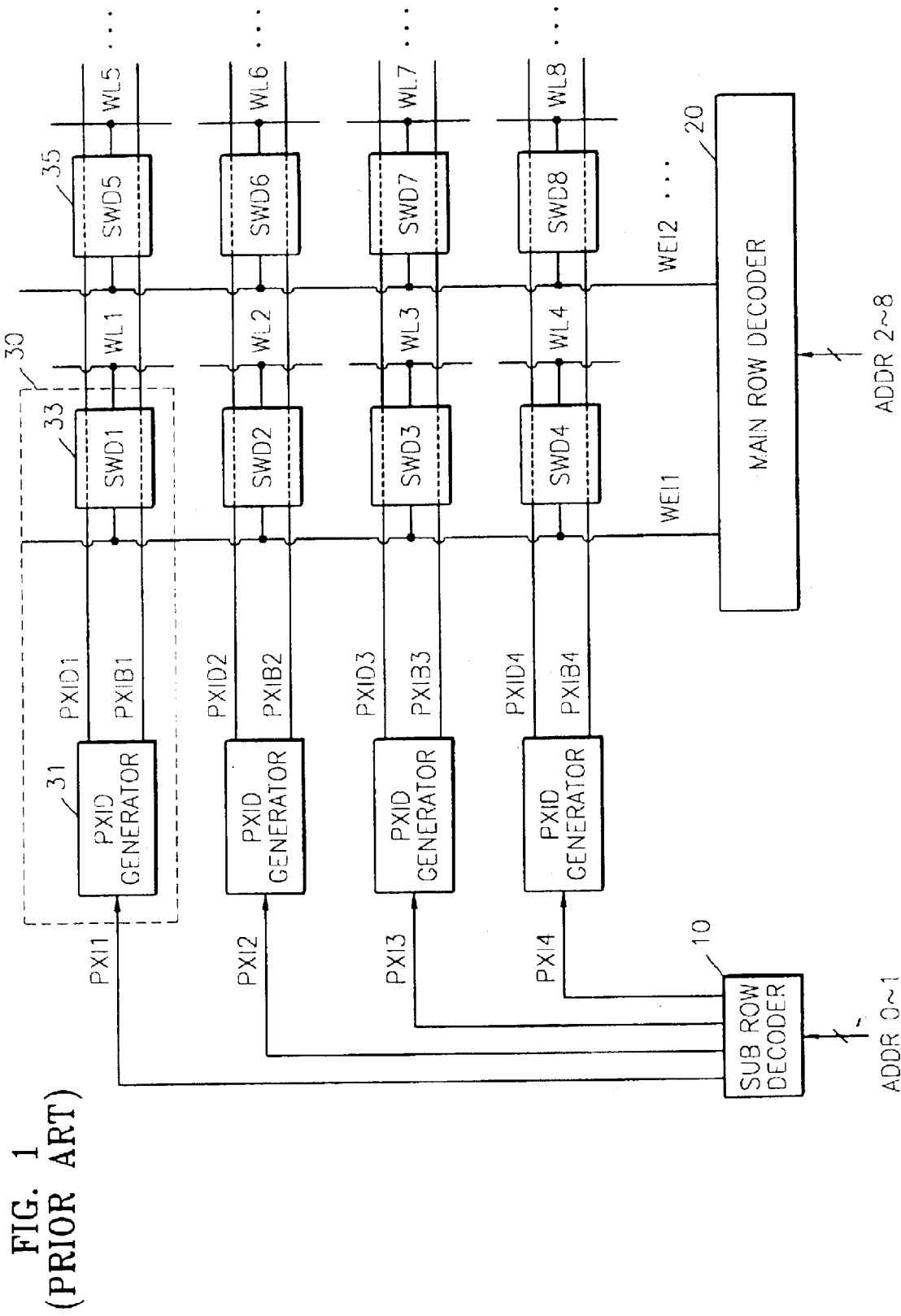
FIG. 1 is a block diagram of a conventional row address decoder.

Hereinafter, the present invention will be described in detail by describing preferred embodiments of the invention with reference to the accompanying drawings. Like reference numerals refer to like elements throughout the drawings.

Figure 4:
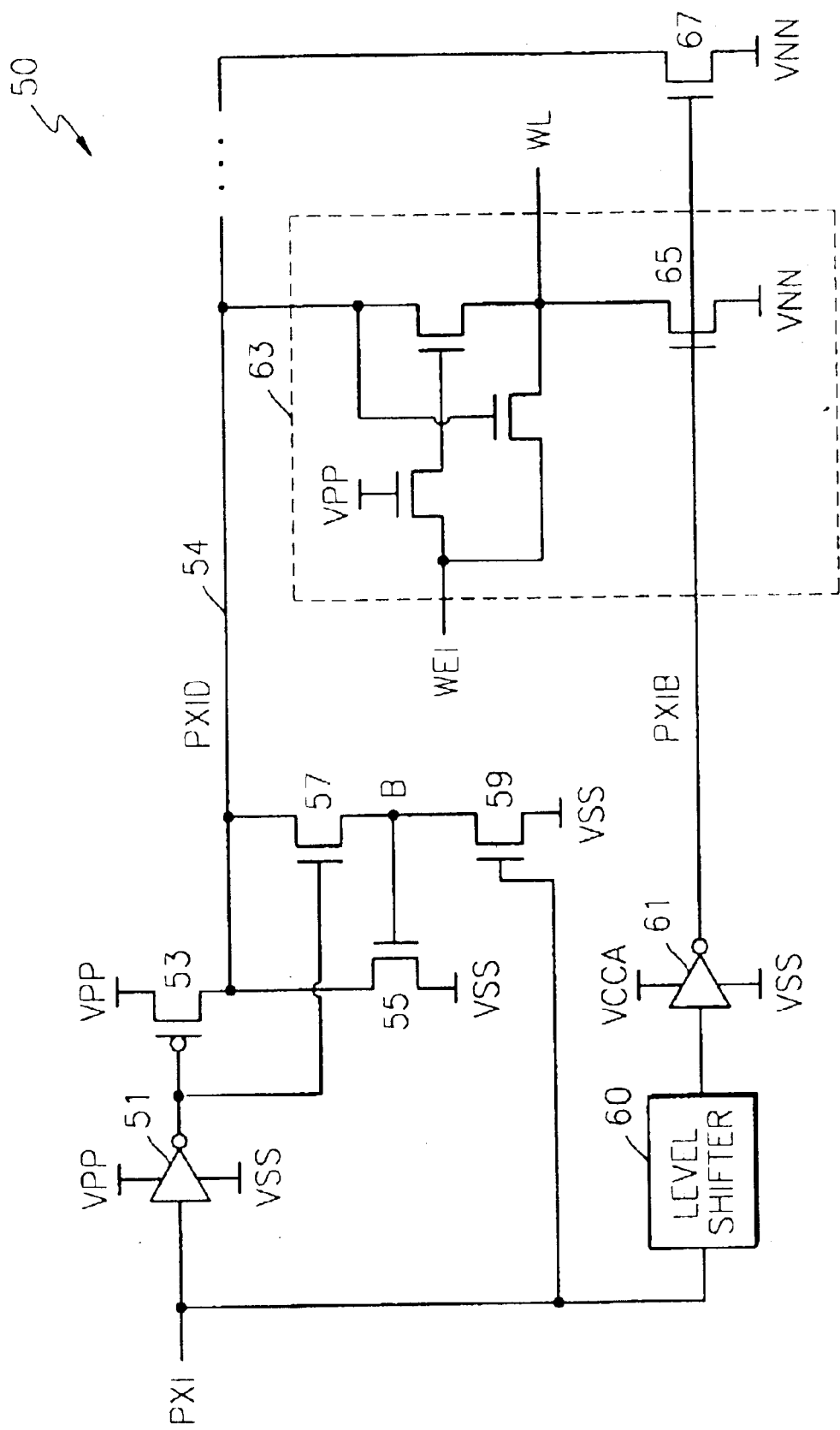
FIG. 4 illustrates a word line select circuit for a semiconductor memory device having a negative word line structure according to an embodiment of the present invention.

FIG. 4 illustrates a word line select circuit of a semiconductor memory device having a negative word line structure according to an embodiment of the present invention. Referring to FIG. 4, a word line select circuit 50 includes inverters 51 and 61, a level shifter 60, transistors 53, 55, 57, 59, and 67, and a sub word line driver 63.

Figure 2:
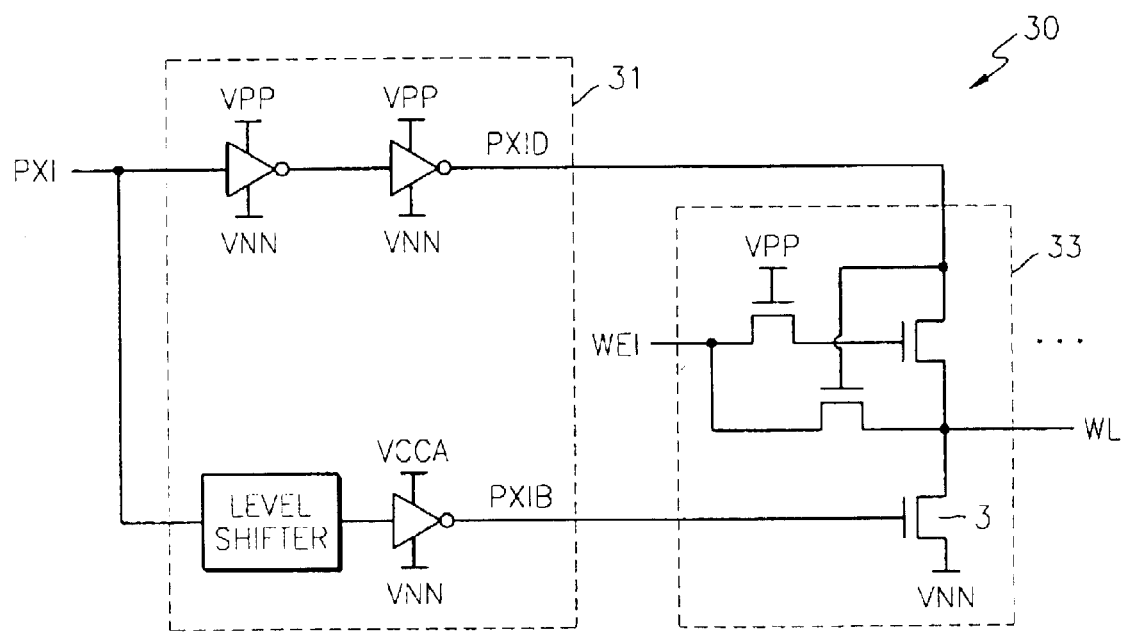
FIG. 2 is a circuit diagram of the word line select circuit shown in FIG. 1.
Figure 3:
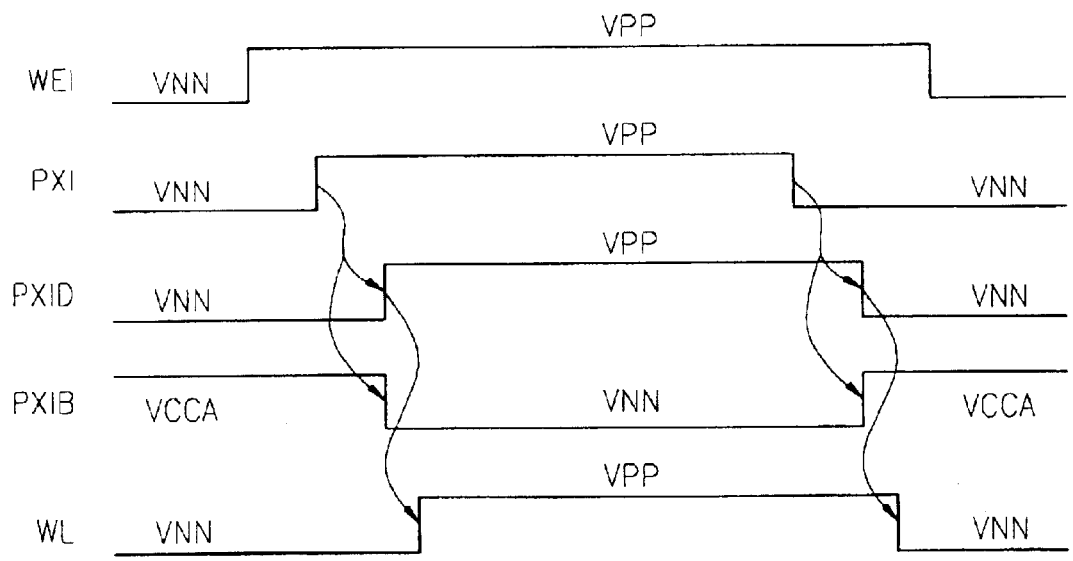
FIG. 3 is a timing diagram for operation of the circuit shown in FIG. 2.

The structure and operation of sub word line driver 63 are the same as those of sub word line driver 33 of FIG. 2, and thus a detailed description thereof is omitted.

That is, if a word line WL is selected in response to a main word line select signal WEI and a sub word line select signal PXI, the word line WL is boosted at the level of the boosting voltage VPP.

The sub word line select signal PXI is input to the input terminal of the inverter 51 and of the level shifter 60, and to the gate of transistor 59, respectively. The output terminal of inverter 51 is connected to the gates of transistors 53 and 57, respectively. The output signal of inverter 51 swings between a ground voltage VSS and the boosting voltage VPP.

The level shifter 60 shifts the level of the PXI at a predetermined level. The output terminal of level shifter 60 is electrically connected to the input terminal of the inverter 61. The output signal of the inverter 61 swings between the ground voltage VSS and a supply voltage VCCA.

Transistor 53 is connected between the boosting voltage VPP and a PXID line 54.

Transistor 55 is connected between the PXID line 54 and the ground power supply VSS. The gate of transistor 55 is connected to a node B.

Transistor 57 is connected between PXID line 54 and node B. Transistor 59 is connected between node B and ground power supply VSS.

The output terminal of inverter 61 is connected to the gates of transistors 65 (in sub word line driver 63) and 67.

Transistor 67 is connected between PXID line 54 and negative power supply VNN. Preferably, transistor 67 is positioned in a conjunction region as a transistor for discharging the PXID and word lines through a separate path to the negative power supply VNN.

As used herein, the terms "ground power supply" and "ground voltage" may have the same meaning, and the terms "negative power supply" and "negative voltage" may have the same meaning.

Preferably, transistors 55 and 57 are formed to have a normal threshold voltage, or a threshold voltage lower than the normal threshold voltage through ion implantation. Preferably, transistors 59, 65, and 67 are formed to have a threshold voltage higher than the normal threshold voltage.

Figure 5:
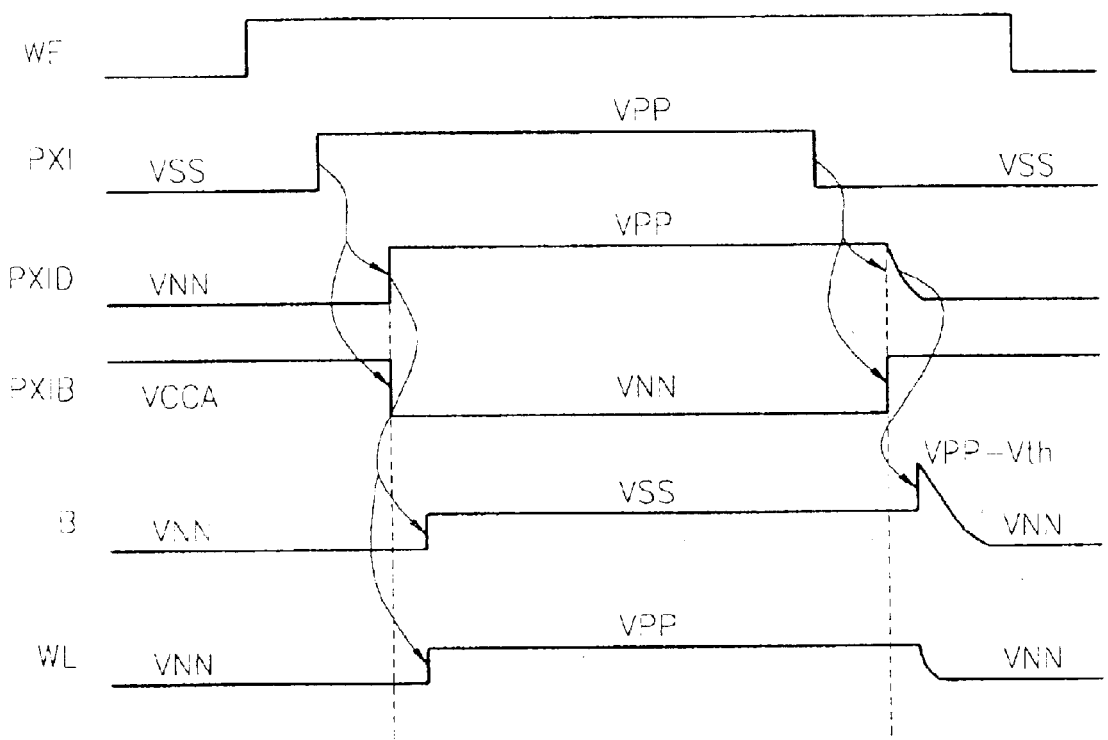
FIG. 5 is a timing diagram for operation of the circuit shown in FIG. 4.

FIG. 5 is a timing diagram for operation of the circuit shown in FIG. 4. Referring to FIGS. 4 and 5, the main word line select signal WEI is deactivated (for example, low) after the PXID line 54 and the word line WL are discharged to a VNN level; thus, the PXID line 54 and the word line WL maintained almost the same voltage level when the main word line select signal WEI is reactivated (for example, high). Hereinafter, the word line WL and the PXID line 54 may essentially be viewed as one line when WEI is activated.

The word line select circuit 50 discharges the word line WL to ground power supply VSS through transistor 55 using the level of the word line WL (or PXID line) until the transistor 55 is turned off, and simultaneously, the word line select circuit 50 discharges the word line WL into the negative power supply VNN through the transistor 65. Word line WL is discharged only to negative power supply VNN through the transistor 65 once transistor 55 is turned off. Transistor 67 performs the same function as transistor 65.

When the PXI of signal is at a VSS level and the main word line select signal WEI is activated (for example, in a precharge or standby state), inverter 51 turns off transistor 53.

Inverter 61 turns on transistors 65 and 67 and thus, the PXID line, the word line WL, and node B are pulled down to the level of the negative voltage VNN.

Subsequently, when the main word line select signal WEI is maintained in an active state and PXI transition from VSS to VPP (for example, when the semiconductor memory device is placed into an active state, where "active state" means a state where data is written into or read from the semiconductor memory device.), inverter 51 turns on transistor 53, and thus the PXID line and the word line WL are pulled up to the level of the boosting voltage VPP.

Transistor 59 is also turned on when PXI transitions to VPP, and thus node B is pulled down to the ground voltage VSS. Transistors 65 and 67 are turned off in response to the output signal PXIB of inverter 61 having the level of the ground voltage VSS.

When PXI subsequently transitions from VPP to VSS, so as to discharge the PXID line 54 and the word line WL, inverter 51 turns on transistor 57. Thus node B is pulled up to a VPP-Vth level, where, Vth represents the threshold voltage of transistor 57.

Transistor 55 is turned on in response to the VPP-Vth level of node B. In addition, transistors 65 and 67 are turned on in response to the output signal PXIB of inverter 61 having the level of the supply voltage VCCA.

As shown in FIG. 5, preferably, the main word line select signal WEI is deactivated after word line WL is discharged to the level of the negative voltage VNN.

The PXID line and the word line WL are discharged to VSS through transistor 55, and simultaneously, are discharged to negative voltage VNN through transistors 65 and 67. In addition, node B is discharged through transistor 55, and simultaneously through transistors 65 and 67.

That is, while the main word line select signal WEI is maintained in an active state, the PXID line, the word line WL, and the node B are discharged to the ground power supply VSS through transistor 55 until transistor 55 reaches a threshold voltage, and simultaneously, are discharged to negative voltage VNN through transistors 65 and 67.

In detail, the transistor 55 forms a first current path, and transistors 65 and 67 form a second current path. The first and second current paths are turned on in response to PXI transitioning low. The first current path is turned off in response to a reduction in the voltage at node B.

When the level of node B reaches the threshold voltage of transistor 55, transistor 55 is turned off. Thereafter, the PXID line, the word line WL, and node B (through transition 57) continue to discharge to the negative voltage VNN through transistors 57, and 65.

In a method for discharging a word line according to an embodiment of the present invention, the PXID line is discharged to a first power supply (for example, VSS) through a first switch until the first switch (for example, the transistor 55), that is connected to the PXID line, reaches a threshold voltage. Simultaneously, the PXID line is discharged to a second power supply (VNN) through a second switch (for example, transistors 65 and 67) that is connected to the PXID line or to the word line WL. The PXID line and the word line WL are discharged only to the second power supply VNN through the second switch 65 and 67 after the first switch 55 reaches the threshold voltage.

As described above, the first switch 55 can be a first transistor having a first threshold voltage, and the second switch 65 or 67 can be a second transistor having a second threshold voltage, where the second threshold voltage is preferably higher than the first threshold voltage.

When the level of the PXID line and node B are at the level of the negative voltage VNN, the transistor 59 has a high threshold voltage so as to prevent current (or charge) from flowing towards the ground voltage VSS.

In addition, the current-driving capability of transistor 55 is higher than those of the transistors 65 and 67, and thus, most of current of the PXID line, the word line WL, and node B is discharged to the ground voltage VSS through transistor 55. Thus, in the method for discharging a word line and the semiconductor memory device using the same as described, current consumption of the negative voltage generator is reduced.

Referring back to FIGS. 4 and 5, the level of node B becomes the level of the negative voltage VNN in the precharge or standby state of the semiconductor memory device, and thus, the PXID line and the word line WL are stably maintained at the level of the negative voltage VNN. In addition, the level of node B is maintained at the level of the ground voltage VSS in the active state of the semiconductor memory device.

The semiconductor memory device according to the illustrated embodiment includes: a first pull-up circuit 53 for pulling up the PXID line 54 to the level of the boosting voltage VPP in response to the word line select signal PXI; a first node B; a switch 57 for connecting the first node B to the PXID line 54 in response to the word line select signal PXI; a first pull-down circuit 55 for pulling down the PXID line 54 towards the level of the ground voltage VSS in response to the voltage at the first node B; and a second pull-down circuit 65 for pulling down the PXID line 54 to the level of the negative voltage VNN. The first pull-down circuit 55 is deactivated (for example, is turned off) when the voltage at node B becomes lower than the threshold voltage of the transistor 55 constituting the first pull-down circuit 55.

A method for discharging a word line according to an embodiment of the present invention may be understood with reference to FIG. 4. Here, discharging the PXID line is included in discharging the word line WL. In addition, the word line WL is connected to the PXID line 54 through a predetermined transistor, and thus, the word line WL may be construed to include the PXID 54 when the predetermined transistor is on.

The word line WL and the PXID line are discharged to the first power supply (for example, VSS) through a predetermined switch 55 until the predetermined switch 55 that is connected to the PXID line 54 reaches a threshold voltage. Simultaneously, the word line WL and the PXID line are discharged to the second power supply (for example, VNN) until the switch 55 reaches the threshold voltage and is turned off.

In addition, in this method the current of the PXID line 54 is discharged to the second power supply VNN after the switch 55 is turned off in response to the reduced voltage of the PXID line 54.

Since most of the current of the PXID line 54 and the word line WL according to this embodiment of the present invention is preferably discharged to the ground voltage VSS through the transistor 55 until the transistor 55 reaches the threshold voltage, the level of the negative voltage VNN can be stably maintained. Accordingly, it becomes easier to design the negative voltage VNN generator to stably supplying the negative voltage VNN to the PXID line 54 and the word line WL.

As described above, in the method for discharging a word line and the semiconductor memory device according to the present invention, the current of the PXID and the word line can be discharged to the ground voltage VSS and the negative voltage VNN using the level of the PXID and the word line, and thus, burdens to the negative voltage during a discharge operation may be alleviated, and thereby the level of the negative voltage VNN can be stably maintained.

Since the level of the negative voltage VNN of the semiconductor memory device is stably maintained, the refresh characteristics of the semiconductor memory device can be improved. In addition, most of the current of the PXID and the word line is discharged to the ground voltage VSS, and thus, current consumption of the negative voltage generator can be reduced.

Since the level of the negative voltage VNN can be stably maintained by a small capacity negative voltage generator, an area in which the negative voltage generator is arranged can be reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for discharging a word line, the method comprising:
    discharging the word line to a first power supply through a first switch that is connected to the word line until the first switch reaches a threshold voltage, and simultaneously, discharging the word line to a second power supply through a second switch that is connected to the word line; and
    discharging the word line to the second power supply through the second switch after the first switch reaches the threshold voltage.

2. The method of claim 1, wherein the first switch is a first transistor having a first threshold voltage, and the second switch is a second transistor having a second threshold voltage, and the second threshold voltage is higher than the first threshold voltage.

3. The method of claim 1, wherein the word line includes a sub word line select signal line.

4. The method of claim 1, wherein the first power supply is ground power supply, and the second power supply is a negative power supply.

5. A method for discharging a word line, the method comprising: discharging the word line to a first power supply through a first switch that is turned on in response to the voltage of the word line, and simultaneously, discharging the word line to a second power supply through a second switch that is connected to the word line; and discharging the word line to the second power supply through the second switch after the first switch is turned off in response to a reduction in voltage on the word line.

6. The method of claim 5, wherein the first switch is a first transistor having a first threshold voltage, and the second switch is a second transistor having a second threshold voltage, and the second threshold voltage is higher than the first threshold voltage.

7. The method of claim 5, wherein the word line includes a sub word line select signal line.

8. A method for discharging a word line, the method comprising:
    discharging the word line to a first power supply through a first current path that is formed in response to a predetermined word line select signal and the voltage of the word line, and simultaneously, discharging the word line to a second power supply through a second current path that is formed in response to the word line select signal; and
    discharging the word line to the second power supply through the second current path when the first current path is blocked in response to a reduction voltage on the word line.

9. The method of claim 8, wherein the first current path is formed using a first transistor having a predetermined threshold voltage.

10. The method of claim 9, wherein the second current path is formed using a second transistor having a predetermined threshold voltage, and the threshold voltage of the second transistor is higher than that of the first transistor.

11. The method of claim 8, wherein the first power supply is ground power supply, and the second power supply is a negative power supply.

12. A semiconductor memory device comprising:
    a word line;
    a first switch that is connected between the word line and a first power supply and discharges the word line to the first power supply in response to a word line select signal and the voltage of the word line; and
    a second switch that is connected between the word line and a second power supply and discharges the word line to the second power supply in response to the word line select signal.

13. The device of claim 12, wherein the first power supply is ground power supply, and the second power supply is a negative power supply.

14. The device of claim 12, wherein the first switch is a first transistor having a first threshold voltage, and the second switch is a second transistor having a second threshold voltage, and the second threshold voltage is higher than the first threshold voltage.

15. A semiconductor memory device comprising:
    a word line;
    a transistor that is connected between the word line and a first power supply and discharges the word line to the first power supply in response to a word line select signal and the voltage of the word line; and
    a second switch that is connected between the word line and a second power supply and discharges the word line to the second power supply in response to the word line select signal.

16. The device of claim 15, wherein the first power supply is ground power supply, and the second power supply is a negative power supply.

17. A semiconductor memory device comprising:
    a word line;
    a first pull-up circuit for pulling up the word line to the level of a boosting voltage in response to a first logic level of a word line select signal;
    a first node;
    a switch for connecting the first node to the word line in response to a second logic level of the word line select signal;

a first pull-down circuit for pulling down the word line towards the level of a ground voltage in response to the voltage of the first node; and a second pull-down circuit for pulling down the word line to the level of a negative voltage in response to the second logic level of the word line select signal;

wherein the first pull-down circuit is deactivated when the voltage of the first node becomes lower than a predetermined voltage.

18. A semiconductor memory device comprising:

a word line;

a first pull-down circuit to discharge the word line to a first power supply in response to a word line select signal, the first pull-down circuit having the capability to turn itself off when the voltage on the word line reaches a first voltage level; and a second pull-down circuit to discharge the word line to a second power supply, with a voltage level lower than that of the first power supply, in response to the word line select signal.

19. The device of claim 18, wherein the first power supply is a ground reference and the second power supply is a negative voltage generator located on the device.

20. The device of claim 19, the first pull-down circuit comprising:

a first transistor connected between the word line and the ground reference, and controlled by the voltage at the first node; a second transistor connected between the first node and the ground reference; and a third transistor connected between the word line and the first node;

wherein the second transistor is activated when the word line select signal is asserted, and the third transistor is activated when the word line select signal is asserted.

21. The device of claim 20, wherein during discharge the word line connects to the first and third transistors through a sub word line select signal line, the first pull-down circuit also serving to discharge the sub word line select signal line.

22. The device of claim 20, wherein the first transistor, when on, has the ability to draw substantially more current from the word line than the second pull-down circuit can draw.

* * * * *

UNITED STATES PATENT AND TRADEMARK OFFICE
CERTIFICATE OF CORRECTION

PATENT NO. : 6,813,216 B2
DATED : November 2, 2004
INVENTOR(S) : Lee

Page 1 of 1

It is certified that error appears in the above-identified patent and that said Letters Patent is hereby corrected as shown below:

Column 10,
Line 13, "select signal is asserted." should read -- select signal is deasserted. --.

Signed and Sealed this

Twenty-eighth Day of June, 2005

JON W. DUDAS
*Director of the United States Patent and Trademark Office*